252-149. AU 165 EX
6-26-73 XR 3,741,905

United States Patent Office 3,741,905
Patented June 26, 1973

3,741,905

PREPARATION OF THROUGH HOLE PRINTED CIRCUIT BOARDS, AND COMPOSITIONS USEFUL THEREFOR

Edward B. Saubestre and Lawrence J. Durney, Hamden, Conn., assignors to Enthone, Incorporated, New Haven, Conn.

No Drawing. Filed Sept. 28, 1967, Ser. No. 671,243
Int. Cl. C11d 7/08; C23g 1/02
U.S. Cl. 252—142 12 Claims

ABSTRACT OF THE DISCLOSURE

This invention concerns an improvement in the process for rendering electrically conductive the non-conductive walls of the holes in the insulating boards or base in the preparation of through hole printed circuit boards, whereby the formation of a weakly adherent copper layer on the copper-clad surface portions of the board is inhibited with attendant elimination of the prior requirement of a sanding removal of the weakly adherent electroless copper prior to the electroplating. The improvement is provided by having present in an acidic liquid solution utilized to treat the board including the walls of the through holes prior to the activating and electroless copper plating, an effective amount of a lower alkyl thiourea. The acidic liquid solution containing the alkyl thiourea can be, for example, an acidic neutralizing solution utilized to neutralize alkaline material (derived from an alkaline cleaner) present on the board surface, or an acidic sensitizer solution for sensitizing the board surfaces for the activating step.

BACKGROUND OF THE INVENTION

(1) Field of the invention

This invention relates to preparation of printed circuits, and more particularly to an improvement in the process for rendering electrically conductive the walls of the holes or apertures extending through the insulating board or base in the preparation of through hole printed circuit boards. Additionally this invention relates to new compositions of matter and especially new and improved sensitizer solutions and sensitizer concentrates.

(2) Description of the prior art

Printed circuit boards have gained prominence in recent years in the electronics industry. The circuit boards are made up of an insulating material having electrical conductors on one or both sides of the insulating board. In the circuit boards of the type having electrical conductors formed on both sides of the board, apertures or holes have been formed through the board at appropriate locations to enable conductive connections to be provided between the electrical conductors on the opposite sides. The lateral walls of these through holes have been rendered electrically conductive by electroless metal plating.

One procedure known in the prior art for preparing printed circuit boards of the type having electrical conductors on both sides or top and bottom of the insulating board and through holes in the board for enabling the connections to be made between the conductors on both sides, has been to drill the holes at the appropriate locations through the insulating board clad on both sides with a layer of copper, for instance a copper foil sheet adhered to each side of the board, clean the copper and nonconductive surfaces of the board by immersion in an alkaline cleaner at elevated temperature, and then etch the board to further clean the copper. The board was then dipped in a dilute HCl solution to remove any residues present, followed by sensitizing the non-conductive lateral walls of the holes by applying thereto, usually by immersing the board in, a readily oxidizable metal salt-, usually stannous chloride-, containing sensitizer solution, activating the sensitized non-conductive walls by applying thereto, usually by immersing the board in, a noble metal salt-, usually palladium chloride-, containing activator solution, and then depositing a layer of copper onto the activated non-conductive lateral walls of the through holes by contacting the board with, usually by immersing the board in, a chemical reduction copper plating bath for a period sufficient to deposit on the walls of the holes an electrically-conductive copper layer. A water rinse of the board was carried out between steps. Copper was then electroplated over the electroless copper coating and the clad copper on the board. The particular pattern of the circuit desired was then formed on the thus-plated board by, for instance, applying to the copper plated surfaces an etchant resist material by screen printing or otherwise, and then etching away the copper not covered by the resist material by immersing the board in a suitable etching solution. The resist was then removed leaving the electrically conductive pattern of metal.

A disadvantage of considerable magnitude is posed by this prior preparation method, and this disadvantage is the formation of a weakly adherent copper deposit on the copper clad surfaces during the electroless plating. Consequently, this weakly adherent copper deposit must be removed from the copper clad surfaces prior to electroplating in copper electroplating baths and especially alkaline copper electroplating baths, for instance alkaline copper pyrophosphate electroplating baths. This removal of the poorly adherent copper from the copper clad surfaces has been done in the past by mechanically sanding the surfaces prior to the electroplating. This sanding requirement is time-consuming, troublesome and, needless to say, involves appreciable additional expense.

SUMMARY OF THE INVENTION

In accordance with the present invention, the prior requirements of the sanding removal of weakly adherent electroless copper deposits from the electrically-conductive metallic surface portion or portions of the substrate is eliminated, and a firmly adherent electrically conductive copper layer deposited on the metallic surface portion of the substrate and also on the electrically non-conductive surface portion or portions of the substrate adjacent the conductive metal-clad surface portions. This is accomplished by having present in an acidic liquid solution or solutions, which can be, for example, an acidic neutralizing solution and/or the acidic sensitizer solution, utilized to treat the substrate including the non-conductive surface portions thereof prior to the activating and electroless copper plating steps, an effective amount of a lower alkyl thiourea. By virtue of the lower alkyl thiourea in the sensitizer, there is inhibited or prevented the formation of a weakly adherent copper layer or deposit on the conductive copper-surface portion of the substrate during the subsequent electroless copper plating, with attendant elimination of the disadvantageous sanding removal requirement prior to electroplating. The thus-treated, sensitized non-conductive surface portion or portions of the substrate are then activated by treatment or contact with an activator solution of a readily reducible metal salt wherein the metal in the metallic valence state is catalytic to chemical reduction deposition of electroless copper, followed by electroless copper plating of the activated non-conductive and conductive surface portions of the substrate by treating or contacting such surface portions with a chemical reduction copper plating solution for a period sufficient to deposit thereon an electrically conductive copper layer. The resulting conductive copper surface portions of the substrate can then be copper electroplated in conventional manner. The process herein is characterized by being a considerable improvement in the industry over the prior preparation processes from the standpoint of (1) eliminating the time-consuming and troublesome sanding removal requirement, (2) attaining consistently firm adhesion of the electroless copper deposit to the conductive copper clad surface portions as well as to the non-conductive surface portions, and (3) economy and simplicity.

More specifically, the process of this invention is eminently well suited for and concerns electrolessly depositing an electrically conductive copper layer on the non-conductive lateral wall surfaces of through holes extending through an insulating board, for instance a plastic board, and also on the conductive copper-clad surfaces in the preparation of printed circuit boards of the type having copper electrical conductors formed on both sides of the insulating board with the apertures extending through the board at appropriate locations to enable conductive connections to be provided between the conductors on the two major opposite sides of the board. The non-conductive wall surfaces of the apertures are electrolessly copper plated by a procedure comprising contacting the boards or substrates by immersing the apertured boards in or otherwise treating such boards with an acidic solution or solutions containing the lower alkyl-thiourea in accordance with the invention, for instance an acidic neutralizing solution utilized to neutralize alkaline material present on the surface of the board and containing the alkyl thiourea as an additive, or the acidic readily-oxidizable metal salt-containing sensitizer solution utilized to sensitize the non-conductive aperture wall surfaces of the boards prior to the activating and containing the alkyl thiourea as an additive, preferably a stannous salt, e.g. stannous chloride, sensitizer solution containing such thiourea additive. The sensitized boards are then activated by immersion in or otherwise treating the board with the acidic noble metal salts—usually palladous chloride—containing activator solution, followed by contacting the activated apertured boards by immersing the boards in or otherwise contacting such boards with a chemical reduction copper plating bath for a period sufficient to deposit a conductive copper layer on the electroless copper layer on the aperture wall surfaces. The conductive copper on the board is then electroplated with copper in conventional manner, for instance with alkaline pyrophosphate copper electroplating baths. Water rinsing is preferably employed between the steps of the process. The particular pattern of the circuit desired can then be formed in well known manner, for instance by that procedure previously referred to herein.

The effective amount of the lower alkyl-thiourea utilized in the acidic solution, be it the acidic neutralizing solution, acidic sensitizer solution or other acidic solution, is a minor amount sufficient to inhibit the formation of a weakly adherent electroless copper layer on the conductive copper-clad surface portion of the substrate or board. Preferred amounts of the lower alkyl-thiourea are from about 0.01–1.0 percent by weight based on total acidic solution.

Although the lower alkyl thioureas herein gave excellent results in the acidic solutions herein, all other thio compounds and sulfur-containing compounds tested in the acidic stannous salt sensitizer solutions were found to give unsatisfactory results due to either no adhesion or weak adhesion of the electroless copper layer. These unsatisfactory compounds were benzothiazole, 2-mercaptobenzothiazole, ethylene thiourea, phenyl thiourea, sodium thiocyanate, sodium thiosulfate, and diethyl dithio carbamate.

The lower alkyl-thiourea herein has the formula

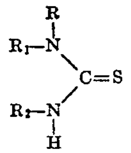

wherein R and $R_2$ are each a lower alkyl radical or a hydrogen atom and $R_1$ is a lower alkyl radical, with the proviso that when R is hydrogen, $R_2$ is either hydrogen or a lower alkyl radical, and when R is a lower alkyl radical, $R_2$ is hydrogen. By "lower alkyl" as used herein is meant a 1–8 C inclusive alkyl radical. Alkyl-thioureas included within such formula are di-lower alkyl thioureas such as, for example, 1,1'-dimethyl-thiourea, 1,1'- diethylthiourea, 1,1' - diisopropylthiourea, 1,1' - di-sec-butylthiourea, 1,1' - isobutyl-ethyl-thiourea, 1,1' - diamylthiourea, 1,1' - dioctylthiourea, 1,3 - dimethylthiourea, 1,3 - diethylthiourea, 1,3 - diisopropylthiourea, 1,3 - di-sec-butylthiourea, 1 - isobutyl - 3 - ethyl-thiourea, 1,3-diamylthiourea, 1,3 - dioctylthiourea, 1,3-dihexylthiourea, 1,1' - dihexylthiourea, 1,3 - diheptylthiourea and 1,1'-diheptylthiourea. The lower alkylthioureas herein are readily obtainable in commerce.

Although we do not intend to be bound by theory, formation of a weakly adherent electroless copper layer on the clad copper conductive surface portion of the substrate or board by the alkyl thiourea in accordance with the invention resides in the adsorption of the lower alkyl-thiourea on the copper clad surface thereby interfering with and inhibiting the adsorption of the tin salt of the sensitizer on the clad copper surface. Consequently when the substrate is contacted with the activator solution, the noble metal or other readily reducible metal of the metal salt of the activator solution will not form an excessive immersion deposit on the copper clad surface and only a limited or relatively small amount of the activator or catalytic metal will be deposited on the copper. Accordingly when the substrate is contacted with the chemical reduction copper plating solution, the copper will deposit relatively slowly on the clad copper surface portion and in only limited amount with good formation and firm adherence to the copper, as contrasted with the relatively large amount of electroless copper that rapidly deposits on the clad copper surface with weak adherence in the absence of the lower alkyl-thiourea.

The problem of weak adherence of the copper electroplate to the copper-clad surface portions of the substrate due to the weakly adherent intermediate electroless copper layer is especially pronounced when alkaline copper electroplating baths are employed for the electroplating, for instance a conventional alkaline copper pyrophosphate copper electroplating bath. In the case of the acid copper electroplating baths employing sulfuric acid as acid ingredient, the sulfuric acid apparently dissolves away most if not all of the weakly adherent electroless copper layer from the copper-clad surface portions prior to the electroplating deposition of the copper.

The new composition of matter provided by this invention, in its broader aspects, comprises a mixture of a readily oxidizable metal salt, a lower alkyl thiourea, a non-oxidizing inorganic acid, and an inert liquid solvent for these ingredients. Exemplary of such oxidizable metal salts are stannous salts and di- and tri-valent titanium salts of inorganic acids, preferably of strong inorganic or mineral acids, for example such salts of the monobasic halogen acids, HX, wherein the X is a halogen atom of atomic number in the range 17–35 inclusive. Such strong inorganic acids, i.e. hydrochloric and hydrobromic acid, are characterized by being non-oxidizing acids. Exemplary of such stannous and titanium salts are stannous chloride, stannous bromide, titanium dichloride, titanium trichloride, titanium dibromide and titanium tribromide.

The chlorides are preferred and stannous chloride is preferred among the chlorides. However any readily oxidizable metal salt that is compatible in the composition, i.e. non-reactive with the other ingredients to the material detriment of the composition, and that will effectively sensitize a non-conductive surface for the subsequent activation treatment and reduce the catalytic metal ions of the activator solution during the activating step to deposit the catalytic metal on such surface, can be utilized in the sensitizer compositions of this invention. Exemplary of the non-oxidizing inorganic or mineral acid ingredient are the strong inorganic non-oxidizing acids, e.g. the halogen acids, HX, where X is a halogen atom of atomic number in the range 17–35 inclusive, i.e. HCl and HBr. Such non-oxidizing inorganic free acid ingredient is preferably utilized in the compositions as a concentrated acid, typically of HCl or HBr concentration of 37 weight percent or higher.

The compositions herein have utility as sensitizer solutions when larger amounts of inert liquid solvent are employed, and as a sensitizer concentrate when relatively small amounts of the solvent are utilized and adapted to be admixed with additional quantities of the solvent to form the ready-to-use sensitizer solution, for sensitizing the electrically non-conductive surfaces in preparation for activating. It will usually be advantageous from a cost standpoint to prepare the sensitizer in the concentrate form when it is to be shipped an appreciable distance to a customer, to eliminate the expense of shipping water. The customer can readily prepare the ready-to-use sensitizer solution from the concentrate simply by admixing the required additional amount of water with the concentrate, in accordance with instructions furnished by the producer.

The new and improved sensitizer solution of this invention is the prior acidic readily oxidizable metal salt-containing sensitizer solution having a minor amount of the lower alkyl-thiourea added thereto or incorporated therein in accordance with this invention. The resulting novel composition is a considerable improvement in this art by reason of sensitizing the electrically non-conductive wall surfaces of the through holes of the printed circuit boards, or the non-conductive surface portions of other substrates, while concomitantly therewith supplying an agent, viz the lower alkyl-thiourea, to the adjacent conductive copper-clad surface portion or portions of the board which inhibits the subsequent deposition of a weakly adherent electroless copper layer on such conductive copper-clad surface portion of the board. The minor amount of the lower alkyl-thiourea in the new and improved sensitizer solution herein is that amount which will accomplish this desired result, i.e. inhibit the formation of the weakly adherent electroless copper layer on the conductive copper-clad surface portion or portions. The readily oxidizable metal salt and the non-oxidizing inorganic free acid ingredient of the sensitizer solutions herein are those hereinbefore disclosed. The inert liquid solvent in the sensitizer solution as well as in all other compositions within the spirit and scope of this invention including the sensitizer concentrates herein, is preferably an aqueous liquid solvent such as water. However other inert liquid solvents utilizable in place of the water are lower alkanols, e.g. ethanol and methanol.

The ready-to-use sensitizer solutions of this invention will usually contain proportions of ingredients within the following ranges:

| | Percent by weight |
|---|---|
| $SnCl_2$ | About 2–20. |
| HCl | About 2–20. |
| Lower alkyl thiourea | About 0.01–1.0. |
| $H_2O$ | Remainder. |

Other readily oxidizable metal salt-containing sensitizer solutions herein wherein titanium trichloride is the metal salt will typically contain proportions of ingredients within the following ranges:

| | Percent by weight |
|---|---|
| $TiCl_3$ | About 2–20. |
| HCl | About 2–20. |
| Lower alkyl thiourea | About 0.01–1.0. |
| $H_2O$ | Balance or remainder. |

The lower alkyl thiourea-containing sensitizer solutions herein in their ready-to-use state have a pH of less than 3, and typically a pH in the range 0–1.

The sensitizer concentrate herein contains the same ingredients as the ready-to-use sensitizer solution except that the concentrate contains a relatively small amount of the inert liquid solvent, in contrast to the relatively large amount of such solvent contained by the sensitizer solution. The lower alkyl-thiourea is added to or incorporated in the sensitizer concentrate in a minor amount, sufficient to inhibit the formation of a weakly adherent electroless copper deposit or layer on the conductive copper-clad surface portion when applied thereto in the ultimate ready-to-use sensitizer solution. One sensitizer concentrate, which is usually a liquid solution, will contain the following ingredients within the typical proportion ranges specified:

| | Percent by weight |
|---|---|
| $SnCl_2$ | About 23.6–47.1. |
| HCl | About 25.3–50.5. |
| Lower alkyl thiourea | About 0.5–1.0. |
| $H_2O$ | Balance or remainder. |

This sensitizer concentrate is adapted for mixing together with an inert liquid solvent, usually an inert aqueous liquid solvent such as water, to form the ready-to-use sensitizer solution in a parts by weight ratio usually within the ratio range of 1:7 to 1:15 respectively. Another sensitizer concentrate of this invention will contain the following ingredients typically within the proportion ranges specified:

| | Percent by weight |
|---|---|
| $TiCl_3$ | About 23.6–47.1. |
| HCl | About 25.3–50.5. |
| Lower alkyl thiourea | About 0.5–1.0. |
| $H_2O$ | Balance or remainder. |

The titanium trichloride-containing sensitizer concentrate will typically be mixed together with an inert liquid solvent, usually an inert aqueous liquid solvent such as water, to form the ready-to-use sensitizer solution in a concentrate-liquid solvent weight ratio within a ratio range similar to that previously disclosed herein for the mixing of the stannous chloride-containing sensitizer concentrate and the aqueous liquid solvent or water. The percentages of ingredients in both of the foregoing stannous chloride- and titanium trichloride-containing sensitizer concentrates are by weight.

The lower alkyl thiourea-containing sensitizer concentrates of this invention usually have a pH of less than 2.

The activator is a solution of a readily reducible metal salt wherein the metal is catalytic to the chemical reduction copper plating or electroless copper deposition. The activator is preferably an acidic noble metal salt-containing aqueous solution. The noble metal salt is, for example, a platinum group metal, gold, or silver salt, for instance the chloride of such metals. Palladium chloride is a preferred noble metal salt for use in the activator solution. Exemplary activator solutions follow:

Activator solution A:

| | | |
|---|---|---|
| $PdCl_2$ | g | 1 |
| HCl | ml | 10 |
| $H_2O$ | gallon | 1 |

Activator solution B:

| | | |
|---|---|---|
| $AuCl_3$ | g | 1 |
| HCl | ml | 2 |
| $H_2O$ | ml | 1000 |

The electroless copper plating solutions herein are conventional solutions containing copper ions, a reducing agent for ionic copper, a complexing agent for the copper ions, and water. An exemplary chemical reduction or electroless copper plating bath follows:

| | Grams per liter |
|---|---|
| Copper sulfate | 29 |
| Sodium carbonate | 25 |
| Rochelle salt | 140 |
| Versene T | 17 |
| Sodium hydroxide | 40 |
| Formaldehyde (37% solution) | 166 |

pH 11.5.
Temperature 70° F.

"Versene T" is a soluble salt of ethylenediamine tetracetic acid.

The copper electroplating bath or solution can be a conventional copper electroplating solution such as, for instance, a conventional aqueous alkaline copper pyrophosphate electroplating bath. Exemplary of such an alkaline copper pyrophosphate electroplating bath is the following:

| | Ounces per gallon |
|---|---|
| Cu (as pyrophosphate) | 4 |
| $P_2O_7^{-4}$ | 25 |

Ammonia 0.3 fl. oz.
pH adjust to 8–9.

Alternatively a conventional acid copper electroplating bath can be utilized.

Prior to the sensitizing, the non-conductive surfaces of the boards including the wall surfaces of the through holes or apertures, if not already clean, are preferably cleaned by, for instance, immersing the boards in a conventional hot alkaline liquid cleaner. The clad copper surfaces, if not already clean, are also preferably cleaned prior to the sensitizing by, for instance, immersing the boards in a hot etching bath, e.g. a hot ammonium persulfate bath, to etch and clean the clad copper surfaces.

The considerable improvement obtained by the presence of the lower alkyl-thiourea in the sensitizer is evidenced by the following:

Eight hundred and ninety-two (892) boards of the type having copper foil electrical conductors clad on both sides of a plastic insulating panel with through holes formed in the panels at appropriate locations, were treated in accordance with the following procedure for purpose of copper plating the wall surfaces of the holes to provide conductive connections between the conductors on both sides:

(1) Cleaned by immersion in a conventional alkaline cleaner for 3 minutes at a cleaner temperature of 180° F.

(2) Water rinsed.

(3) Immersed in a hot ammonium persulfate bath for 30 seconds at a bath temperature of about 130° F. and a concentration of ammonium persulfate of 1.5 lbs./gallon, to etch and clean the clad copper surfaces.

(4) Water rinsed.

(5) Immersed in a 50% HCl (technical grade) aqueous solution for 2 minutes to neutralize and remove residual alkaline material.

(6) Water rinsed.

(7) Dipped for 30 seconds in a 30% HCl (reagent grade) aqueous solution.

(8) Immersed for 1 minute in an acidic stannous salt sensitizer solution of this invention prepared by: (a) mixing together 1 part by weight of a sensitizer concentrate containing, by weight, 50.5% of HCl, 41.7% of $SnCl_2$ and 7.8% of water, and 30 parts by weight of water, and (b) admixing 1 part by weight of a solution of 1,1'-diethylthiourea of 31% concentration and 3000 parts by weight of the thus-obtained sensitizer solution.

(9) Water rinsed.

(10) Again water rinsed.

(11) Immersed for 1 minute in a conventional activator solution containing palladium chloride, HCl and water.

(12) Water rinsed.

(13) Dipped for 15 seconds in a 10% HCl (reagent grade) aqueous solution

(14) Water rinsed.

(15) (a) 403 of the thus-treated boards were immersed for 12 minutes in a proprietary high speed chemical reduction copper plating bath. (b) The remaining 489 of the boards treated by the procedure of steps 1–14 inclusive supra were immersed for 25 minutes in a proprietary regular speed chemical reduction copper plating bath.

All boards were then inspected for adherence of the electroless copper on the hole walls and hole edges and clad copper surfaces and coverage of the copper on the hole walls and edges. Firm adherence of the electroless copper to the hole walls and edges and to the clad copper surfaces was found on all circuit boards, and no sanding removal of electroless copper was required. All boards were then electroplated with copper in an alkaline copper pyrophosphate bath at 40 amperes per square foot and for 12 minutes. Adhesion of the electroplated copper to the electroless copper was then checked and firm adherence of the copper electroplate was also found.

However, when a plurality of the boards of the same type were treated by the procedure of steps 1–14 and 15(b) aforesaid except that the sensitizer of step 8 did not contain a lower alkyl-thiourea, the electroless copper deposited on the clad copper surfaces was weakly adherent to the clad copper, which necessitated sanding removal of the weakly adherent copper deposit from the clad copper surface prior to electroplating of the boards with copper in the alkaline copper pyrophosphate plating bath. The copper electroplate adhered firmly to the through hole walls and the hole edges and to the sanded clad copper surfaces. However the copper electroplate would have adhered weakly to the clad copper surface if the weakly adherent electroless copper had not been sanded off the clad copper prior to the electroplating.

Although the utility of the improved process of this invention has been specifically disclosed previously herein as being for rendering electrically conductive the non-conductive wall surfaces of insulating boards or bases in the production of through hole printed circuit boards, this invention can be utilized for depositing an electrically conductive copper layer on the electrically non-conductive surface portion of any substrate or article having an electrically conductive copper surface portion adjacent or immediately adjacent the non-conductive surface portion where it is desired to inhibit or prevent the formation of a weakly adherent electroless copper deposit on the conductive surface portion.

Additional test runs were carried out as follows:

A plurality of copper-clad polymer insulating boards having a plurality of through holes therein were copper plated in accordance with the following cycle:

(1) Cleaned by immersion in a conventional alkaline cleaner for 3–5 minutes at a cleaner temperature of 150° F., cold water rinsed.

(2) Immersed in an aqueous solution containing $NaHSO_4$, $NaHF_2$ and NaCl for 15 seconds at room temperature; cold water rinsed.

(3) Immersed in an ammonium persulfate bath for 3 minutes, to etch and clean the clad copper surfaces; cold water rinsed.

(4) Immersed in an aqueous solution containing $NaHSO_4$, $NaHF_2$ and NaCl for 15 seconds at room temperature; cold water rinsed.

(5) Boards treated in accordance with steps 1–4 supra were separately immersed for 90 seconds in a different one of a plurality of separate stannous chloride sensitizer solutions. To a different one of all of the sensitizer solutions except one such solution was added one of the following compounds in solution in a lower alkanol or water: benzotriazole, 2-mercaptobenzothiazole, ethylene thiourea, phenyl thiourea, sodium thiocyanate, sodium thiosulfate, diethyl dithio carbamate and diethyl thiourea. Each solution of such compound was of a compound concentration of about 33% by weight. Each solution of compound was added to the sensitizer solution in a weight ratio of compound solution to sensitizer solution, in parts by weight, of 1:3000 respectively. One of the sensitizer solutions did not have any compound added to it. The sensitizer solutions, prior to the addition of the solutions of compounds, were prepared by mixing together (a) 1 part by weight of a sensitizer concentrate containing, by weight, 50.5% of HCl, 41.7% of $SnCl_2$ and 7.8% of water, and (b) 30 parts by weight of water. Each solution was at room temperature during the immersing of the boards therein; cold water rinsed.

(6) Immersed for 4 minutes in an activator solution containing, by weight, 0.42% $PdCl_2$, 10.00% HCl and 89.58% water at room temperature of the solution; cold water rinsed.

(7) Electrolessly copper plated by immersion for 10 minutes in a chemical reduction copper plating bath at room temperture, such bath obtained by mixing together an "A" concentrate containing by weight, 7% of $CuSO_4 \cdot 5H_2O$, 38% of formaldehyde (of 37% formaldehyde concentration), and 55% water, a "B" concentrate containing, by weight, 3.6% of caustic soda, 1.5% of sodium carbonate, 16% of Rochelle salt and 78.9% of water, and water in the weight ratio of 4 "A" concentrate:4 "B" concentrate:3 water; cold water rinsed.

(8) Electroplated in a conventional alkaline copper pyrophosphate bath for 1 hour at a current density of 20 a.s.f., the temperature of the bath was in the range 120° F.–140° F., and its pH was 8.2; cold water rinsed.

(9) All boards were then carefully examined for copper coverage of the walls of the through holes and for adhesion of the deposited copper to the clad copper on the boards at the outset of the plating cycle. The results of such test runs are set forth in Table I which follows:

| Acidic stannous chloride sensitizer solution contained as additive | Copper coverage of walls of holes | Adhesion of electrolessly plated copper to the clad copper foil |
|---|---|---|
| Benzotriazole | All plated | None. |
| 2-mercaptobenzothiazole | do | Do. |
| Ethylene thiourea | do | Do. |
| Phenyl thiourea | do | Do. |
| Sodium thiocyanate | do | Do. |
| Sodium thiosulfate | do | Poor. |
| Diethyl dithio carbamate | do | Do. |
| 1,3-diethyldithiourea | do | Good. |
| No additive | do | Poor. |

In Table I of the test results, "Poor" adhesion means weak adherence of the plated copper to the clad copper foil which is unsatisfactory adherence, and "Good" adhesion in Table I as well as in Table II hereinafter set forth means a film or strong adherence of the plated copper to the clad copper foil which is an entirely satisfactory adherence. "None" in the adhesion column of the table means no adherence of the plated copper to the clad copper foil. The table of test results shows that although the use of all sensitizer solutions in the cycle resulted in all hole walls being covered with copper, only the use of the sensitizer solution containing the diethyldithiourea in the cycle resulted in good adhesion of the plated copper to the clad copper foil. The use in the plating cycle of all other sensitizer solutions containing the different additive compounds resulted in either no adhesion or poor adhesion of the plated copper to the clad copper foil. The use of the acidic stannous chloride sensitizer solution containing no additive compound in the plating cycle resulted in poor adhesion of the plated copper to the clad copper foil.

Additional test runs were conducted on a plurality of copper clad polymer insulating boards having a plurality of through holes therein following a cycle substantially the same as that of the cycle last-disclosed herein and consisting of steps 1–9, except that a solution of one of the following compounds of a compound concentration of about 33% by weight were added to the separate stannous chloride sensitizer solution: 1,3-dimethylthiourea, 1,3 - diethylthiourea, 1,3-diisopropylthiourea, 1,3-di-sec-butylthiourea, 1-isobutyl-3-ethylthiourea, 1,3-diamylthiourea and 1,3-dioctylthiourea. The results of such additional test runs are set forth in Table II hereafter.

TABLE II

| Acidic stannous chloride sensitizer solution contained as additive | Copper coverage of walls of holes | Adhesion of electrolessly plated copper to the clad copper foil |
|---|---|---|
| 1,3-dimethylthiourea | All plated | Good. |
| 1,3-diethylthiourea | do | Do. |
| 1,3-diisopropylthiourea | do | Do. |
| 1,3-di-sec-butylthiourea | do | Do. |
| 1,3-diamylthiourea | do | Do. |
| 1,3-dioctylthiourea | do | Do. |
| 1,diisobutyl-3-ethylthiourea | do | Do. |

The test results of Table II were obtained with the utilization of the additive solution in a weight ratio of such solution to the sensitizer solution, in parts by weight, of 1:3000 respectively. However similar good results as are set forth in Table II were obtained when the additive solution was utilized in a weight ratio of such solution to the sensitizer solution, in parts by weight, of 1:1000 respectively and 1:6000 respectively.

By "readily oxidizable" as used herein in referring to the metal salt of the sensitizer solution is meant a metal salt, for example stannous chloride, wherein the metal is in a lower valence state and which can be converted to a higher valence state in a non-lengthy period of time, usually less than 10 minutes, which renders the metal salt suitable for use in a commercially practicable sensitizer solution for sensitizing electrically non-conductive surfaces in preparation for activating with a catalytic metal and thereafter electrolessly copper plating the substrate. By "readily reducible" as used herein in referring to the metal salt of the activator solution wherein the metal is catalytic to the chemical reduction plating or electroless plating of copper is meant a metal salt, for example, palladous chloride, wherein the metal is in a higher valence ionic state and can be converted to a zero valence metallic state in a non-lengthy time period, usually less than 5 minutes, which renders the metal salt suitable for use in a commercially practicable activator solution for activating sensitized non-conductive surfaces with a catalytic metal, in preparation for the chemical reduction copper plating.

What is claimed is:

1. In an acidic sensitizer solution containing a stannous salt selected from the group consisting of stannous chloride and stannous bromide, and a halogen acid of the formula HX wherein X is a halogen atom of atomic number in the range 17–35 inclusive, the improvement which comprises having present in the solution a minor amount, sufficient to inhibit formation of a weakly adherent copper deposit on a copper-clad surface portion of a substrate during electroless copper plating of the substrate, of a lower alkyl-thiourea.

2. The sensitizer solution of claim 1 wherein the alkyl thiourea has the formula

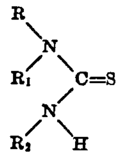

wherein R and $R_2$ are each lower alkyl or hydrogen and $R_1$ is lower alkyl, with the proviso that when R is hydrogen, $R_2$ is either hydrogen or lower alkyl, and when R is lower alkyl, $R_2$ is hydrogen.

3. The sensitizer solution of claim 1 wherein the anion of the halogen acid and the anion of the stannous salt are identical.

4. In an acidic sensitizer solution containing stannous chloride, hydrochloric acid and water, the improvement which comprises having present in the solution a minor amount sufficient to inhibit formation of a weakly adherent copper deposit on a copper-clad surface portion of a substrate during electroless copper plating of the substrate, of a lower alkyl-thiourea.

5. The sensitizer solution of claim 4 wherein the ingredients are contained therein in proportions within the following ranges:

| | |
|---|---|
| $SnCl_2$ | About 2–20%. |
| Lower alkyl-thiourea | About 0.01–1.0%. |
| HCl | About 2–20%. |
| $H_2O$ | Balance. |

all percentages being by weight.

6. In an acidic sensitizer concentrate solution containing a stannous salt selected from the group consisting of stannous chloride and stannous bromide, and a halogen acid of the formula HX wherein X is a halogen atom of atomic number in the range 17–35 inclusive, the improvement which comprises having present in the sensitizer concentrate solution a minor amount, sufficient to inhibit formation of a weakly adherent copper deposit on a copper-clad surface portion of a substrate during electroless copper plating of the substrate, of a lower alkyl-thiourea.

7. The sensitizer concentrate of claim 6 wherein the halogen acid and stannous salt have identical anions.

8. In an acidic sensitizer liquid concentrate solution containing stannous chloride, hydrochloric acid and a relatively small amount of water and adapted to be mixed together with additional water to form a ready-to-use aqueous acidic sensitizer solution, the improvement which comprises having present in the sensitizer liquid concentrate solution a minor amount, sufficient to inhibit formation of a weakly adherent copper deposit on a copper-clad surface portion of a substrate during electroless copper plating of the substrate, of a lower alkyl-thiourea.

9. The sensitizer concentrate solution of claim 8 wherein the alkyl thiourea has the formula:

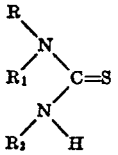

wherein R and $R_2$ are each lower alkyl or hydrogen and $R_1$ is lower alkyl, with the proviso that when R is hydrogen, $R_2$ is either hydrogen or lower alkyl, and when R is lower alkyl, $R_2$ is hydrogen.

10. The sensitizer concentrate solution of claim 9 containing the ingredients in proportions within the ranges specified:

| | |
|---|---|
| SnCl | About 23.6–47.1%. |
| Lower alkyl-thiourea | About 0.5–1.0%. |
| HCl | About 25.3–50.5%. |
| $H_2O$ | Balance. |

all percentages being by weight.

11. The sensitizer concentrate solution of claim 8 wherein the lower alkyl-thiourea is 1,3-diethyldithiourea.

12. The sensitizer solution of claim 4 wherein the lower alkyl-thiourea is 1,3-diethyldithiourea.

References Cited

UNITED STATES PATENTS

| | | | |
|---|---|---|---|
| 2,485,529 | 10/1949 | Cardwell et al. | 252—149 |
| 2,631,950 | 3/1953 | Rosenfeld et al. | 252—142 |
| 2,937,940 | 5/1960 | Weisberg et al. | 252—142 |
| 2,959,555 | 11/1960 | Martin et al. | 252—149 |
| 3,269,861 | 8/1966 | Schneble, Jr. et al. | 117—5.5 |

WILLIAM E. SCHULZ, Primary Examiner

U.S. Cl. X.R.

117—212; 252—149

UNITED STATES PATENT OFFICE
CERTIFICATE OF CORRECTION

Patent No. 3,741,905 Dated June 26, 1973

Inventor(s) Edward B. Saubestre and Lawrence J. Durney

It is certified that error appears in the above-identified patent and that said Letters Patent are hereby corrected as shown below:

Column 3, line 44, "salts" should read --salt--. Column 4, line 27, --it is believed the mechanism of the inhibition of the-- should be inserted after "theory,". Column 9, line 60, "film" should read --firm--.

Signed and sealed this 13th day of November 1973.

(SEAL)
Attest:

EDWARD M. FLETCHER, JR.
Attesting Officer

RENE D. TEGTMEYER
Acting Commissioner of Patents